(12) United States Patent
Mikata et al.

(10) Patent No.: US 10,714,822 B2
(45) Date of Patent: Jul. 14, 2020

(54) WIRELESS MODULE AND METHOD FOR MANUFACTURING WIRELESS MODULE

(71) Applicant: TAIYO YUDEN CO., LTD., Tokyo (JP)

(72) Inventors: Jin Mikata, Tokyo (JP); Masaya Shimamura, Tokyo (JP); Mikio Aoki, Tokyo (JP); Takehiko Kai, Tokyo (JP); Taiji Ito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/828,178

(22) Filed: Nov. 30, 2017

(65) Prior Publication Data

US 2018/0159209 A1   Jun. 7, 2018

(30) Foreign Application Priority Data

Dec. 1, 2016   (JP) ................................. 2016-233910

(51) Int. Cl.
*H01Q 1/38* (2006.01)
*H01L 23/31* (2006.01)
(Continued)

(52) U.S. Cl.
CPC ............. *H01Q 1/38* (2013.01); *H01L 21/56* (2013.01); *H01L 21/561* (2013.01); *H01L 23/3121* (2013.01); *H01L 23/552* (2013.01); *H01Q 1/2283* (2013.01); *H01Q 1/526* (2013.01); *H01Q 9/42* (2013.01); *B32B 15/08* (2013.01);
(Continued)

(58) Field of Classification Search
CPC ........ H01Q 1/2283; H01Q 1/38; H01Q 1/526; H01L 21/536; H01L 23/3121; H01L 21/56; H01L 21/561; H01L 23/552; H01L 23/3157

See application file for complete search history.

(56) References Cited

U.S. PATENT DOCUMENTS 6,818,985 B1 * 11/2004 Coccioli ............. H01L 23/3128
257/240
7,342,299 B2 * 3/2008 Gaucher ............. H01L 23/5227
257/674

(Continued)

FOREIGN PATENT DOCUMENTS

JP   H11-354689 A   12/1999
JP   2004-165531 A   6/2004

(Continued)

OTHER PUBLICATIONS

Japanese Office Action dated Jun. 5, 2018, in a counterpart Japanese patent application No. 2016-233910. (A machine translation (not reviewed for accuracy) attached.).

(Continued)

*Primary Examiner* — Ab Salam Alkassim, Jr.
(74) *Attorney, Agent, or Firm* — Chen Yoshimura LLP

(57) ABSTRACT

A wireless module, including: a substrate; an electronic circuit mounted in a first region on a one face of the substrate; a conductive pattern formed in a second region on another face of the substrate and serving as an antenna; a resin layer sealing the electronic circuit in the first region; and a shielding layer formed on a surface of the resin layer and having conductivity.

4 Claims, 10 Drawing Sheets

(51) Int. Cl.
  *H01Q 1/22* (2006.01)
  *H01Q 9/42* (2006.01)
  *H01Q 1/52* (2006.01)
  *H01L 23/552* (2006.01)
  *H01L 21/56* (2006.01)
  *B32B 15/08* (2006.01)
  *H01Q 23/00* (2006.01)

(52) U.S. Cl.
  CPC ............... *H01L 2223/6677* (2013.01); *H01L 2224/16227* (2013.01); *H01L 2224/48227* (2013.01); *H01L 2224/97* (2013.01); *H01L 2924/15313* (2013.01); *H01L 2924/3511* (2013.01); *H01Q 23/00* (2013.01)

(56) References Cited

U.S. PATENT DOCUMENTS

| | | | | |
|---|---|---|---|---|
| 8,874,048 | B2* | 10/2014 | Tsutsumi | H01Q 9/00 455/106 |
| 9,832,914 | B2* | 11/2017 | Hyun | H05K 9/0024 |
| 9,881,882 | B2* | 1/2018 | Hsu | H01L 23/3128 |
| 9,887,454 | B2* | 2/2018 | Ito | H01O 23/00 |
| 10,163,867 | B2 | 12/2018 | Kim et al. | |
| 10,256,535 | B2* | 4/2019 | Nguyen | H01L 23/66 |
| 10,283,859 | B2 | 5/2019 | Nguyen et al. | |
| 10,581,157 | B2* | 3/2020 | Ito | H01Q 1/526 |
| 2005/0037535 | A1 | 2/2005 | Ogawa et al. | |
| 2008/0019112 | A1* | 1/2008 | Hatanaka | H01L 23/3121 361/814 |
| 2008/0210462 | A1* | 9/2008 | Kawagishi | H01L 21/561 174/377 |
| 2009/0002967 | A1* | 1/2009 | Asami | H01L 23/552 361/816 |
| 2009/0051606 | A1* | 2/2009 | Ochi | G06K 19/07732 343/702 |
| 2009/0194851 | A1* | 8/2009 | Chiu | H01L 21/568 257/660 |
| 2009/0256244 | A1* | 10/2009 | Liao | H01L 21/568 257/660 |
| 2010/0013064 | A1* | 1/2010 | Hsu | H01L 23/055 257/660 |
| 2010/0032815 | A1* | 2/2010 | An | H01L 23/3121 257/660 |
| 2010/0103058 | A1* | 4/2010 | Kato | H01Q 1/44 343/702 |
| 2010/0207257 | A1* | 8/2010 | Lee | B81B 7/0061 257/660 |
| 2010/0207259 | A1* | 8/2010 | Liao | H01L 21/6835 257/660 |
| 2010/0246143 | A1* | 9/2010 | Dinh | H05K 9/0026 361/748 |
| 2011/0006106 | A1 | 1/2011 | Kanryo et al. | |
| 2012/0304460 | A1* | 12/2012 | Kimura | H01L 23/3121 29/850 |
| 2012/0306063 | A1* | 12/2012 | Kimura | H01L 23/3121 257/659 |
| 2012/0320558 | A1 | 12/2012 | Foster et al. | |
| 2013/0093629 | A1* | 4/2013 | Chiu | H01Q 1/243 343/700 MS |
| 2013/0185934 | A1* | 7/2013 | Toyoda | H05K 3/284 29/841 |
| 2013/0222196 | A1* | 8/2013 | Hashimoto | H01Q 13/10 343/767 |
| 2013/0225102 | A1* | 8/2013 | Tsutsumi | H01L 23/552 455/90.2 |
| 2013/0301227 | A1* | 11/2013 | Kawano | H01L 21/561 361/748 |
| 2014/0028518 | A1 | 1/2014 | Arnold et al. | |
| 2014/0239464 | A1 | 8/2014 | Chung et al. | |
| 2015/0131231 | A1* | 5/2015 | Yoo | H05K 3/284 361/707 |
| 2015/0138030 | A1 | 5/2015 | Yosui et al. | |
| 2015/0194388 | A1* | 7/2015 | Pabst | H01L 23/552 257/659 |
| 2015/0262842 | A1* | 9/2015 | Iijima | H01L 21/52 257/664 |
| 2015/0263403 | A1* | 9/2015 | Spella | H01Q 1/2283 343/905 |
| 2016/0149300 | A1* | 5/2016 | Ito | H01Q 23/00 |
| 2017/0141081 | A1 | 5/2017 | Lee et al. | |
| 2017/0185108 | A1* | 6/2017 | Sasaki | B32B 7/02 |
| 2017/0301985 | A1* | 10/2017 | Nguyen | H01Q 1/2283 |
| 2017/0301986 | A1* | 10/2017 | Nguyen | H01Q 1/2291 |
| 2017/0347462 | A1 | 11/2017 | Miwa | |
| 2017/0354039 | A1 | 12/2017 | Miwa | |
| 2018/0151951 | A1* | 5/2018 | Ikemoto | H01Q 1/52 |
| 2018/0159216 | A1* | 6/2018 | Kai | H01Q 9/42 |
| 2018/0159217 | A1* | 6/2018 | Mikata | H01Q 1/526 |
| 2018/0166767 | A1* | 6/2018 | Ito | H01L 25/00 |
| 2018/0261566 | A1 | 9/2018 | Babcock et al. | |
| 2018/0286816 | A1* | 10/2018 | Kitazaki | H01L 23/3121 |
| 2018/0286817 | A1* | 10/2018 | Kitazaki | H01L 21/561 |
| 2019/0372210 | A1* | 12/2019 | Mikata | H01L 23/66 |

FOREIGN PATENT DOCUMENTS

| | | |
|---|---|---|
| JP | 2006-173256 A | 6/2006 |
| JP | 2006-197143 A | 7/2006 |
| JP | 2008-098898 A | 4/2008 |
| JP | 2010-080699 A | 4/2010 |
| JP | 2011-151226 A | 8/2011 |
| JP | 2013-171980 A | 9/2013 |
| JP | 2013-179152 A | 9/2013 |
| WO | 2013/115158 A1 | 8/2013 |
| WO | 2014/112243 A1 | 7/2014 |
| WO | 2014/196143 A1 | 12/2014 |
| WO | 2015/001820 A1 | 1/2015 |
| WO | 2015/015863 A1 | 2/2015 |
| WO | 2016/092694 A1 | 6/2016 |

OTHER PUBLICATIONS

Japanese Office Action dated May 28, 2019, in a counterpart Japanese patent application No. 2018-173979. (A machine translation (not reviewed for accuracy) attached.).

Japanese Office Action dated Sep. 24, 2019, in a counterpart Japanese patent application No. 2018-173979. (A machine translation (not reviewed for accuracy) attached.).

Japanese Office Action dated Oct. 2, 2018, in a counterpart Japanese patent application No. 2016-233911. (Cited in the related U.S. Appl. No. 15/828,160. A machine translation (not reviewed for accuracy) attached.).

U.S. Appl. No. 15/828,160, filed Nov. 30, 2017.
U.S. Appl. No. 15/832,405, filed Dec. 5, 2017.
U.S. Appl. No. 15/828,191, filed Nov. 30, 2017.

Japanese Office Action dated Oct. 16, 2018, in a counterpart Japanese patent application No. 2016-239086. (Cited in the related U.S. Appl. No. 15/832,405. A machine translation (not reviewed for accuracy) attached.).

Japanese Office Action dated Oct. 11, 2019, in a counterpart Japanese patent application No. 2019-004945. (Cited in the related U.S. Appl. No. 15/832,405. A machine translation (not reviewed for accuracy) attached.).

* cited by examiner

WIRELESS MODULE AND METHOD FOR MANUFACTURING WIRELESS MODULE

CROSS-REFERENCE TO RELATED APPLICATIONS

The present application claims priority upon Japanese Patent Application No. 2016-233910 filed on Dec. 1, 2016 which is herein incorporated by reference.

BACKGROUND

Technical Field

This disclosure relates to a wireless module and a method for manufacturing a wireless module.

Related Art

These days, various electronic devices, i.e., wearable devices, comprise ultra-small wireless modules, each of which is configured such that an electronic circuit and an antenna capable of transmitting or receiving radio wave are mounted on a single substrate. In most cases, in such a wireless module, the electronic circuit on the substrate is covered with a metal case in order to suppress noise from the electronic circuit.

To further downsize such a wireless module without using a metal case, a technique has been developed where the front surface of a substrate is sealed with resin and subsequently a metal layer is formed on the resin surface near the electronic circuit.

However, in this case, an antenna on the substrate as well as the electronic circuit are sealed with resin, and this causes the characteristics of the antenna to deteriorate. In addition, since resin shrinks at a time of curing, a substrate sometimes fails to maintain its flatness. If the substrate deforms, it is not possible to appropriately mount the wireless module on the motherboard of an electronic device. This decreases yield and reliability.

In view of the above, removing resin of an antenna part from the substrate can avoid the deterioration of the antenna characteristics and also can reduce deformation of the substrate. However, this needs fine cutting of resin using a cutting blade such as a dicing apparatus. It is extremely difficult remove only resin of an antenna part without damaging the antenna.

SUMMARY

A wireless module according to an aspect of this disclosure, including: a substrate including a one face, another face, a first region and a second region located adjacent to the first region; an electronic circuit mounted in the first region on the one face of the substrate; a conductive pattern formed in the second region on the other face of the substrate and serving as an antenna, a resin layer sealing the electronic circuit in the first region; and a shielding layer formed on a surface of the resin layer and having conductivity.

In the present application, the problem to be solved as well as the means for solving that problem are described and illustrated in detail in the Detailed Description of Embodiments and Drawings sections.

DETAILED DESCRIPTION

Figure 1:
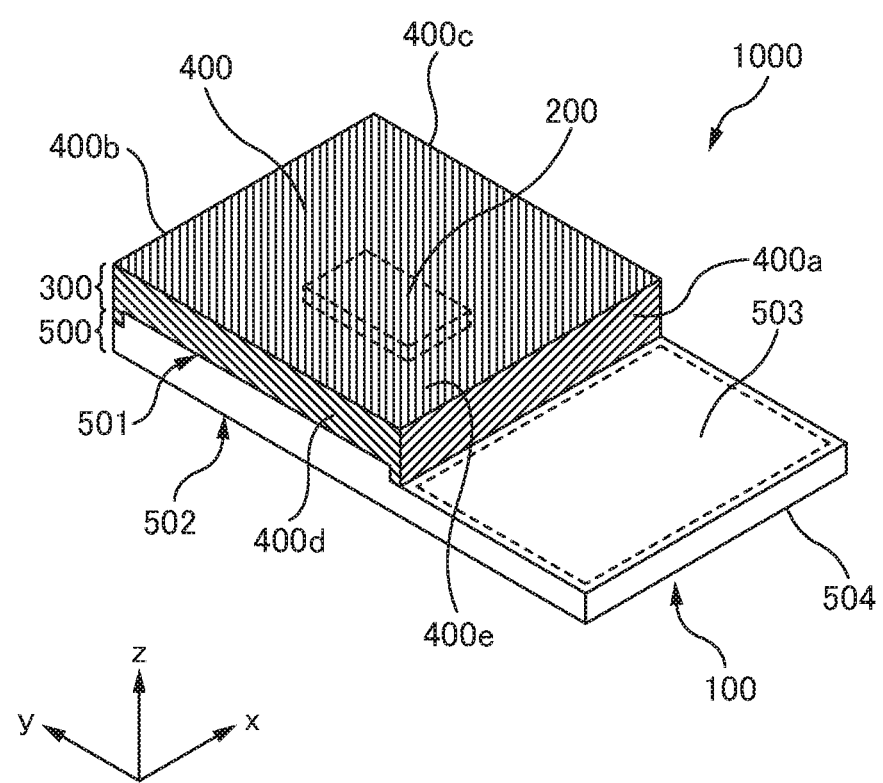
FIG. 1 is an external perspective view of a wireless module according to an embodiment of the present disclosure.

Appropriately with reference to the drawings, a wireless module and a method for manufacturing a wireless module according to the embodiment of this disclosure will be described below. In the drawings, the same components are denoted by the same reference numerals. As used herein, the singular forms "a", "an", and "the" are intended to include the plural forms as well, unless the context clearly indicates otherwise.

Wireless Module

Figure 2:
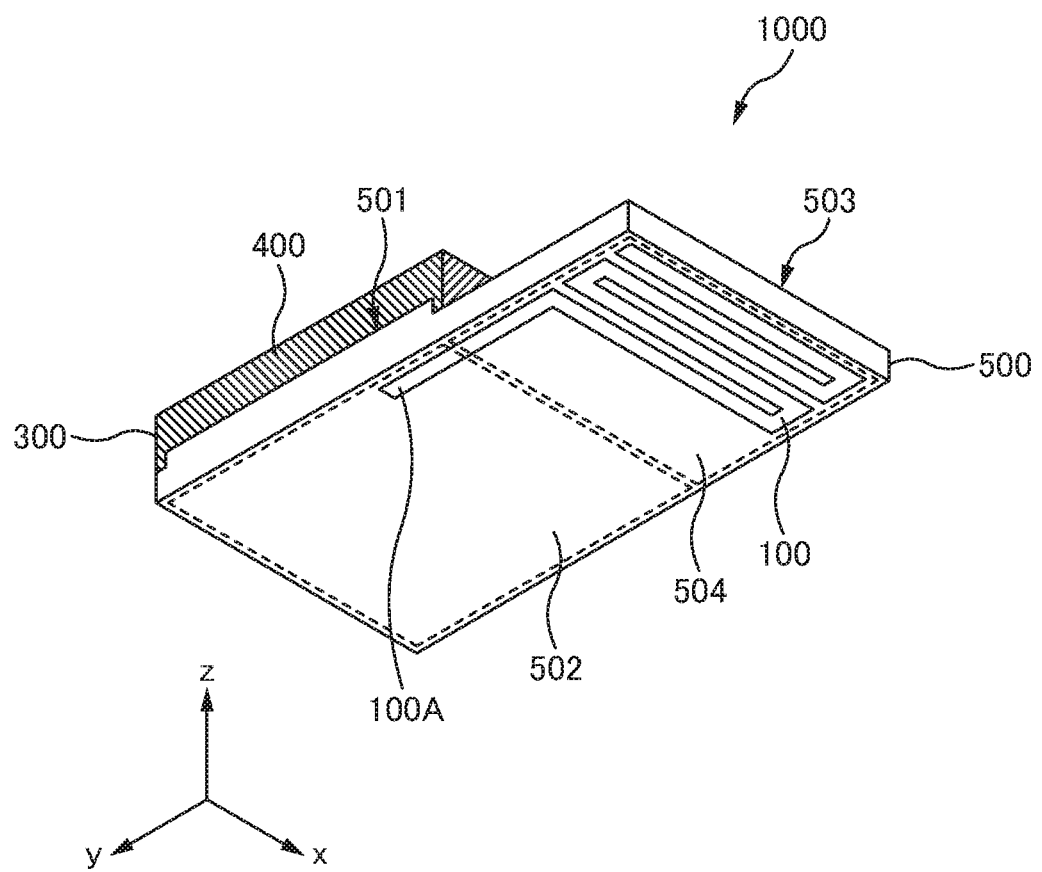
FIG. 2 is an external perspective view of a wireless module according to an embodiment of the present disclosure.
Figure 3:
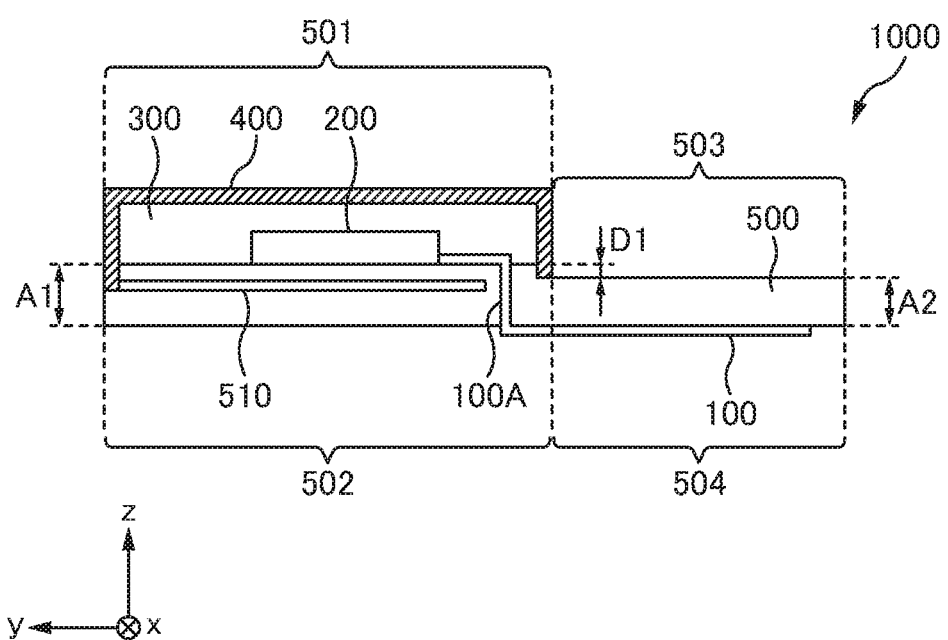
FIG. 3 is a cross-sectional view of a wireless module according to an embodiment of the present disclosure.

FIGS. 1 to 3 show a wireless module 1000 according to an embodiment of the present disclosure. FIGS. 1 and 2 are external perspective views of the wireless module 1000, and FIG. 3 is a cross-sectional view of the wireless module 1000.

In this embodiment, the x-axis direction, the y-axis direction and the z-axis direction are defined as follows. The z-axis direction is defined running in the vertical direction. And, the y-axis direction is defined in a direction in which, when the wireless module 1000 is viewed from above, a first circuit region 501 (the first region) and a first antenna region 503 (the second region) are arranged in line on a surface of a substrate 500 (the one face; to be described later). The x-axis direction is defined in a direction that is orthogonal to both the y-axis direction and the z-axis direction.

The wireless module 1000 includes the substrate 500, an electronic circuit 200, an antenna 100, a resin layer 300 and a shielding layer 400.

The substrate 500 is a multi-layer substrate including a ground layer 510 therein, as shown in FIG. 3. The substrate 500 is a substantially rectangular plate with four sides extending along the x-axis direction or the y-axis direction. The board thickness (the width in the z-axis direction) of the substrate 500 is equal to or less than 1 mm (millimeter), for example approximately 0.3 mm.

On one face of the substrate 500 (the surface facing the positive direction of the z axis in FIG. 1. It is also referred to as a front surface), the first circuit region 501 and the first antenna region 503 are provided so as to be adjacent in line in the y-axis direction, and there is no substantial overlap between these regions 501 and 503. On another face of the substrate 500 (the surface facing the negative direction of the z axis in FIG. 1. It is also referred to as a back surface), the second circuit region 502 and the second antenna region 504 are provided so as to be adjacent in line in the y-axis direction, and there is no substantial overlap between these regions 502 and 504.

The second circuit region 502 is on the back surface of the substrate 500 and is placed in a region opposite to the first circuit region 501; the second antenna region 504 is on the back surface of the substrate 500 and is placed in a region opposite to the first antenna region 503.

The electronic circuit 200 is composed of various electronic components (not shown) such as an IC (Integrated Circuit), a resistance element, a capacitor or a coil. The electronic circuit 200 is mounted in the first circuit region 501 (first region) on the front surface of the substrate 500 (the one face). The electronic circuit 200 includes an oscillator circuit composed of these electronic components, and transmits/receives radio wave using the antenna 100 (to be described later). Note that the phrase that the antenna 100 transmits/receives radio wave includes both of a case where the antenna 100 performs only either one of transmitting or receiving radio wave and a case where the antenna 100 performs both of transmitting or receiving radio wave.

As shown in FIG. 1, the electronic circuit 200 is mounted in the first circuit region 501 on the front surface of the substrate 500 (the one face), and is substantially out of the first antenna region 503.

The antenna 100 is composed of a conductive pattern formed in the second antenna region 504 (the second region) on the back surface of the substrate 500 (the other face). FIG. 2 shows how the antenna 100 is formed in the second antenna region 504.

As shown in FIG. 3, the electronic circuit 200 and the antenna 100 are electrically connected via an antenna connection portion 100A, which is a conductive pattern connecting the front surface (the one face) and the back surface (the other face) of the substrate 500.

Back to FIG. 1, the resin layer 300 is formed in the first circuit region 501 to seal the electronic circuit 200 which is mounted on the front surface of the substrate 500 (the one face). The resin layer 300 is not formed in other areas except for the first circuit region 501. But, the resin layer 300 may be formed throughout the first circuit region 501, or may be formed only in a portion of the first circuit region 501 where the electronic circuit 200 is mounted. The resin layer 300 is made of, for example, UV-curable resin or thermosetting resin such as epoxy resin. However, the present invention is not limited thereto, and it is sufficient that the electronic circuit 200 is sealed with insulating resin material. A method for forming the resin layer 300 will be described later.

Meanwhile, the material of the resin layer 300 has characteristics of shrinking at a time of curing. For example, taking epoxy resin as an example, it can be said as follows. During a curing process in this chemical reaction, epoxy resin exhibits viscous flow at the initial stage, and subsequently changes from a gel to a viscous elastic solid as the chemical reaction goes. When this curing process proceeds, the epoxy resin becomes crosslinking to decrease holes and to shrink spaces between molecules. Consequently, the volume of epoxy resin decreases.

Figure 5A:
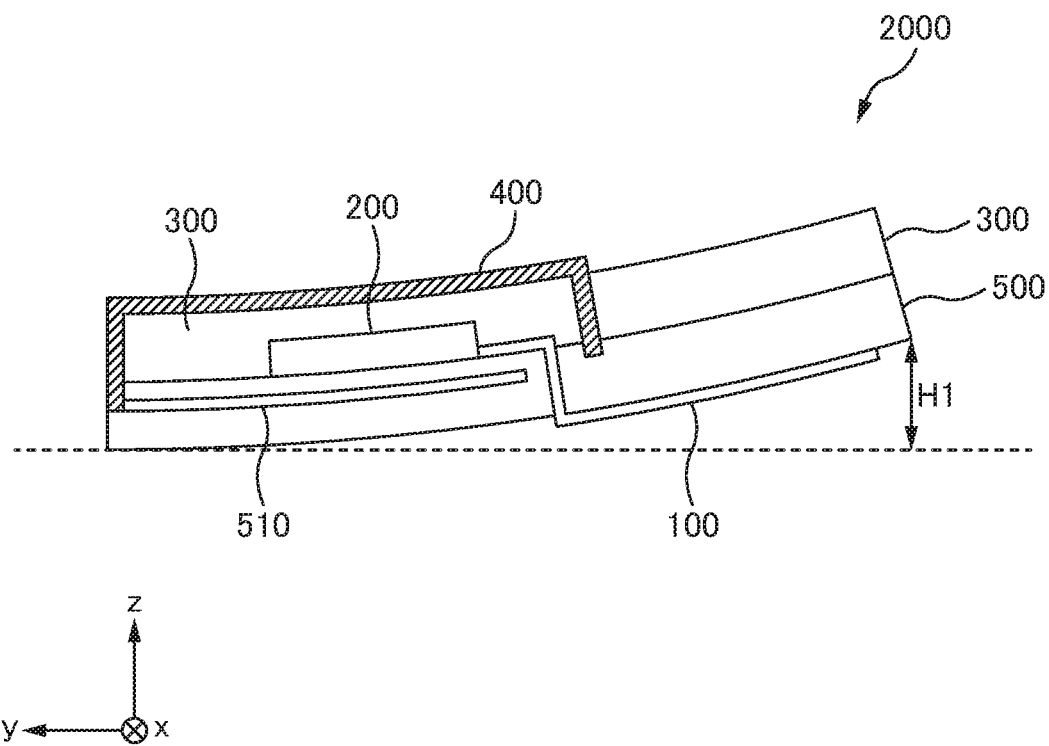
FIG. 5A is a diagram illustrating the flatness of a wireless module different from an embodiment of the present disclosure.

As mentioned above, the thickness of the substrate 500 according to an embodiment of the present disclosure is about 0.3 mm, extremely thin. Accordingly, if the resin layer 300 is formed throughout the front surface of the substrate 500 (the one face), shrinkage stress generated by shrinkage of the resin layer 300 largely affects the entirety of the substrate 500, and is exerted on the substrate 500 to curve the substrate 500. FIG. 5A shows a wireless module 2000 (a wireless module 2000 different from this embodiment) in which the resin layer 300 is formed throughout the front surface of the substrate 500 (the one face). FIG. 5A shows that the amount of deformation of the substrate 500 of the wireless module 2000 is H1.

With reference to FIG. 1, the first circuit region 501 includes the resin layer 300 over active elements such as IC200, chip resistors, chip capacitors, coils and crystal oscillators which are provided on this region 501. On the other hand, in the first antenna region 503, there is no electronic component. Accordingly, assuming that the resin layer is provided in the first antenna region 503, the amount of resin is much greater than the amount of resin in the first circuit region 501, and therefore the shrinkage of resin in the first antenna region 503 is much greater.

As a method for manufacturing a wireless module (to be described later), a plurality of the wireless modules 1000 are generally manufactured so as to be arranged in a matrix on a large substrate. In each of the wireless modules 1000 on the large substrate, the first circuit region 501 and the first antenna region 503 are covered at once, the covering having a thickness to cover the components in the first circuit region 501 (see FIGS. 4C and 4D). For example, if the thickness of resin is 0.6 mm, substantially all resin of this thickness of 0.6 mm shrinks because there is no component in the first antenna region 503 or because the thickness can be negligible even if providing the antenna 100 in a conductive pattern.

Figure 5B:
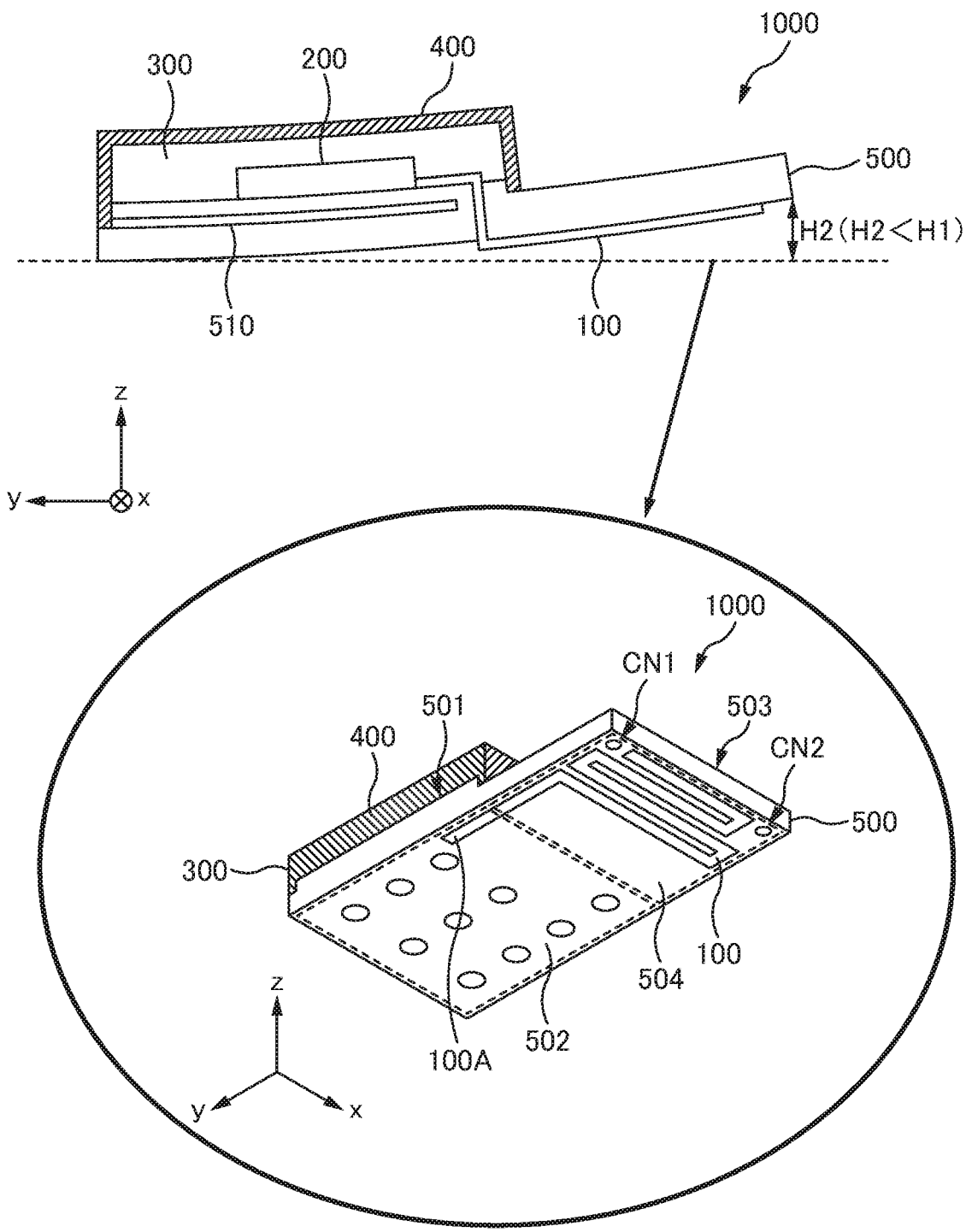
FIG. 5B is a diagram illustrating the flatness of a wireless module according to an embodiment of the present disclosure.

In contrast, as shown in FIG. 5B, in the wireless module 1000 according to an embodiment of the present disclosure, the resin layer 300 is formed not throughout the substrate 500, but only in the first circuit region 501 in which the electronic circuit 200 is mounted. This decreases effect of stress (tension) generated by shrinkage of the resin layer 300, and as a result reduces the amount of deformation of the substrate 500. FIG. 5B shows that the amount of deformation of the substrate 500 of the wireless module 2000 is H2 (H2<H1).

This configuration makes it possible to enhance flatness of the substrate 500 in the wireless module 1000 in which the antenna 100 and the electronic circuit 200 are mounted on the substrate 500 and which is sealed with resin. Accordingly, the wireless module 1000 can be appropriately mounted in the motherboard of an electronic device (not shown), and can enhance yield and reliability.

As for the wireless module 1000, whereas the thickness thereof in the first circuit region 501 and in the second circuit region 502 is 0.9 mm, the thickness thereof in the first antenna region 503 and in the second antenna region 504 is 0.3 mm, substantially the thickness of the substrate 500. Thus, the wireless module 1000 has flexibility. This realizes the following effects by methods such as providing an external terminal in the second circuit region 502 on the back surface of the substrate 500 and providing restricting terminals CN1 and CN2 at least at two corners on the right end of the second antenna region 504, as shown in the diagram encircled in FIG. 5B. That is, a mother substrate and the wireless module 1000 are connected with solder. And, the antenna regions 503 and 504 in which cambers are likely to generate are thin and have flexibility, and this makes it easier to restrict cambers and ensures flatness of the substrate on the back side of the wireless module 1000. That is, the pattern of the antenna 100 maintains flat.

The shielding layer 400 is constituted by film containing metal. For example, if forming the shielding layer 400 by printing, the shielding layer 400 is formed by applying a conductive paste on the surface of the resin layer 300 and thereafter curing it; the conductive paste being a paste in which a powder of at least one metal selected from a group of Au, Ag, Ni, Cu and the like is dispersed in resin. In this embodiment, Ag paste is used as an example.

In plating, Cu, Ag, Au or the like are laminated to form the shielding layer 400. In sputtering, a two-layered structure (Cu, SUS) or a three-layered structure (SUS, Cu, SUS) is laminated from the bottom, to form the shielding layer 400.

As mentioned above, the electronic circuit 200 is sealed with the resin layer 300, and thereafter, the surface of the resin layer 300 is covered with the shielding layer 400 having conductivity. Accordingly, without using a metal case, it is possible to reduce leakage of noise caused by the electronic circuit 200. This makes it possible to downsize the wireless module 1000. Also, it is possible to prevent the antenna 100 from receiving noise from the electronic circuit 200, and as a result, the capabilities for transmitting and receiving radio wave can be improved. Furthermore, it is possible to restrain the electronic circuit 200 from receiving noise from the antenna 100 or external atmosphere.

It is sufficient that the shielding layer 400 is formed on a surface of the resin layer 300, and is located at a position where the layer 400 can suppress leakage of noise caused by the electronic circuit 200. But, the wireless module 1000 according to an embodiment of the present disclosure is formed so that the shielding layer 400 covers the entire surface of the resin layer 300, as shown in FIG. 1. That is, the shielding layer 400 is composed of the following five surfaces: a surface 400e of the shielding layer; a wall 400a on the boundary between the first antenna region 503 and the first circuit region 501; a wall 400b opposite to the wall 400a and being in contact with the ground layer 510; and walls 400c and 400d respectively connecting both ends of the wall 400a and 400b.

This configuration makes it possible to more securely prevent noise leakage from the electronic circuit 200 and noise permeation into the electronic circuit 200. Accordingly, the capability of the antenna 100 can be further improved.

As shown in FIG. 3, the wireless module 1000 according to an embodiment of the present disclosure is formed so that the shielding layer 400 is electrically connected to the ground layer 510 in an inner layer of the substrate 500. Thus, the shielding layer 400 is not required to be grounded using other things such as a wire. This can downsize and simplify the configuration of the wireless module 1000 and reduces the number of components. This makes it possible to decrease the failure rate of the wireless module 1000 and to enhance reliability.

As shown in FIG. 3, the wireless module 1000 according to an embodiment of the present disclosure is formed in which a board thickness A2 in the second antenna region 504 is smaller than a board thickness A1 in the first circuit region 501 (the detail thereof is described later). This configuration makes it possible to reduce effects of the thickness of the substrate 500 when the antenna 100 transmits/receives radio wave. Consequently, in the wireless module 1000, the capabilities for transmitting and receiving radio wave can be improved.

In addition, the wireless module 1000 has a step D1 (difference between the board thickness A1 and the board thickness A2) on the front surface of the substrate 500 (the one face) in a boundary part between the first circuit region 501 and the first antenna region 503, and does not have a step on the back surface of the substrate 500 (the other face).

The foregoing configuration makes it possible to maintain flatness of the back surface of the substrate 500 (the other face), the back surface being a mounting surface when the substrate 500 is mounted on a motherboard (not shown). And, since the substrate 500 is ground enough so that the board thickness A2 of the substrate 500 in the second antenna region 504 is smaller than the board thickness A1 in the first circuit region 501, the thickness of the substrate 500 becomes further small. Accordingly, the substrate 500 can have flexibility, and in addition, connecting restricting pads CN1 and CN2 (FIG. 5B) and motherboard with solder makes it possible to maintain more surely flatness of the substrate 500.

Method for Manufacturing Wireless Module

Next, with reference to FIGS. 4A to 4J, a method for manufacturing the wireless module 1000 according to an embodiment of the present disclosure will be described below.

The wireless module 1000 according to an embodiment of the present disclosure is manufactured by forming a plurality of the wireless modules 1000 as a unit and subsequently by dicing the wireless modules 1000. This method for manufacturing the wireless module 1000 is shown in FIGS. 4B, 4D, 4F, 4H and 4J. In FIGS. 4A to 4J, the dashed lines C indicate cutting lines when dicing the wireless modules 1000.

The substrate 500 is prepared in form of a large substrate 800 (FIG. 4B) in which a plurality of a single wireless modules 1000 (FIG. 1) are arranged in a matrix pattern. A component UNIT is one unit of the wireless module 1000. The large substrate 800 is a so-called printed wiring board. Conductive patterns, vias and through holes are designed so as to function as the wireless module 1000 taking into consideration arrangement of the following components: electronic components mounted in the first circuit region 501 and a circuit thereof; the antenna 100 placed in a second antenna region 503; conductive patterns in inner layers, connecting the electronic components to external connection electrodes and to the antenna 100; and external connection electrodes in the second circuit region 502. Several conductive patterns are prepared according to functions of the wireless module 1000, and a substrate is made by insulating the conductive patterns by an insulation layer and by stacking them. Note that parts indicated by dot dashed lines are parts to be grooves and dicing lines (both to be described later).

Figure 4A:
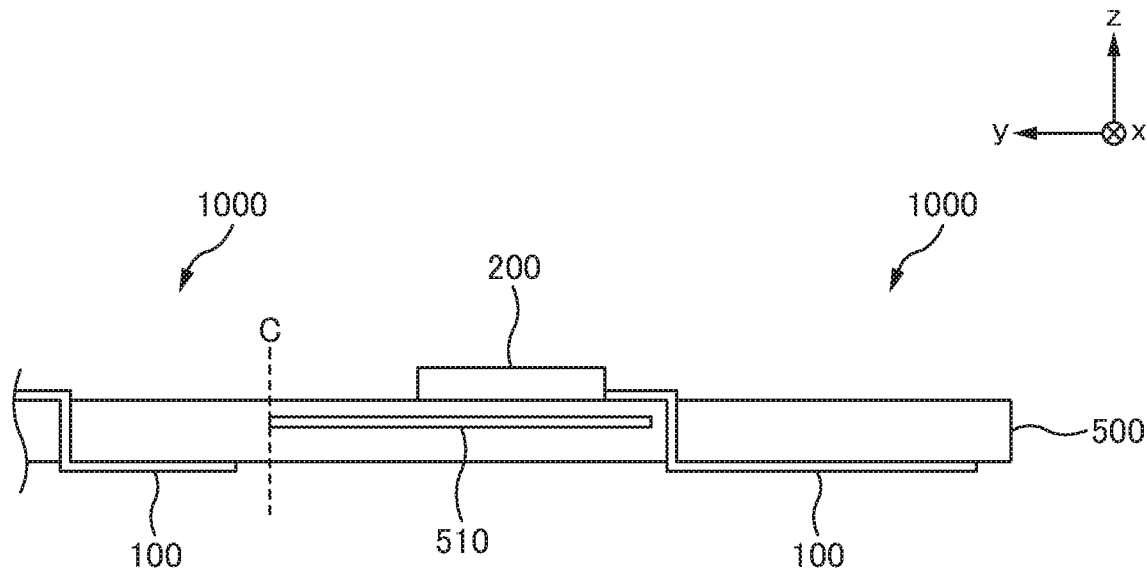
FIG. 4A is a diagram illustrating a method for manufacturing a wireless module according to an embodiment of the present disclosure.

First, a method for manufacturing the substrate 500 which includes the antenna 100 will be described below, as shown in FIG. 4A (antenna-forming step).

The antenna forming process may be performed at the same time as the aforementioned process for manufacturing the substrate 500, or may be performed separately after finishing the substrate 500. Generally, forming the antenna at the same time as manufacturing the substrate 500 can simplify the processes and can reduce cost.

That is, the antenna 100 and the restricting pads CN1 and CN2 are formed at the same time as forming the conductive patterns on the back surface of the substrate 500. The conductive patterns are each composed of a solder pad for solder ball, wiring on one end of which the solder pad is connected, electrodes connecting to vias and through holes which are connected conductive patterns of the inner layers on the other end of the wiring, and the like. Since, the conductive pattern are generally wiring mainly made of Cu, the antenna 100 and the restricting pads CN1 and CN2 are composed of patterns mainly made of Cu. In some cases, the pad for a solder ball part is plated with Ni/Au from below; in these cases, the surface of the antenna 100 and the surfaces of the restricting pads CN1 and CN2 may be plated. The antenna 100 is covered with solder resist, but it is thin, and therefore the plating film may be employed for preventing oxidation.

Vias and through holes associated with connecting of the antenna 100 are formed, when manufacturing the substrate 500, simultaneously with vias and through holes constituting the circuit of the wireless module 1000.

Since a solder ball is formed, the foregoing solder resist is employed in the pad for a solder ball and in the restricting pads CN1 and CN2. The entire surface of the substrate 500 is coated with this solder resist, and openings are formed by etching so that those pads are exposed.

On the front surface of the substrate 500, at least wiring which connects electronic components is provided. On the back surface of the substrate 500, a pad for external connection is provided in the second circuit region 502, and the antenna 100 and the restricting pads CN1 and CN2 are provided in the second antenna region 504. In inner layers of the substrate 500, formed are wiring, vias, through holes and the like which connect a conductive pattern on the front surface of the substrate 500 to a conductive pattern on the back surface of the substrate 500.

A concrete method for manufacturing the substrate 500 is commonly known, and the description thereof will be omitted. A conductive pattern is realized by attaching Cu foil and by etching using photolithography technique. Through holes and vias are made by laser processing, drilling or etching. The insides of vias and through holes are filled using plating, and are connected to each other.

In the substrate manufacturing process according to an embodiment of the present disclosure, the antenna 100 are formed, and also the antenna connection portion 100A and the ground layer 510 are formed inside the substrate 500. At this occasion, the ground layer 510 is formed so that, when the substrate 500 is cut at a cutting line C, the ground layer 510 is exposed on the cutting surface.

By the foregoing processes, the substrate 500 or the large substrate 800 is prepared.

Figure 4B:
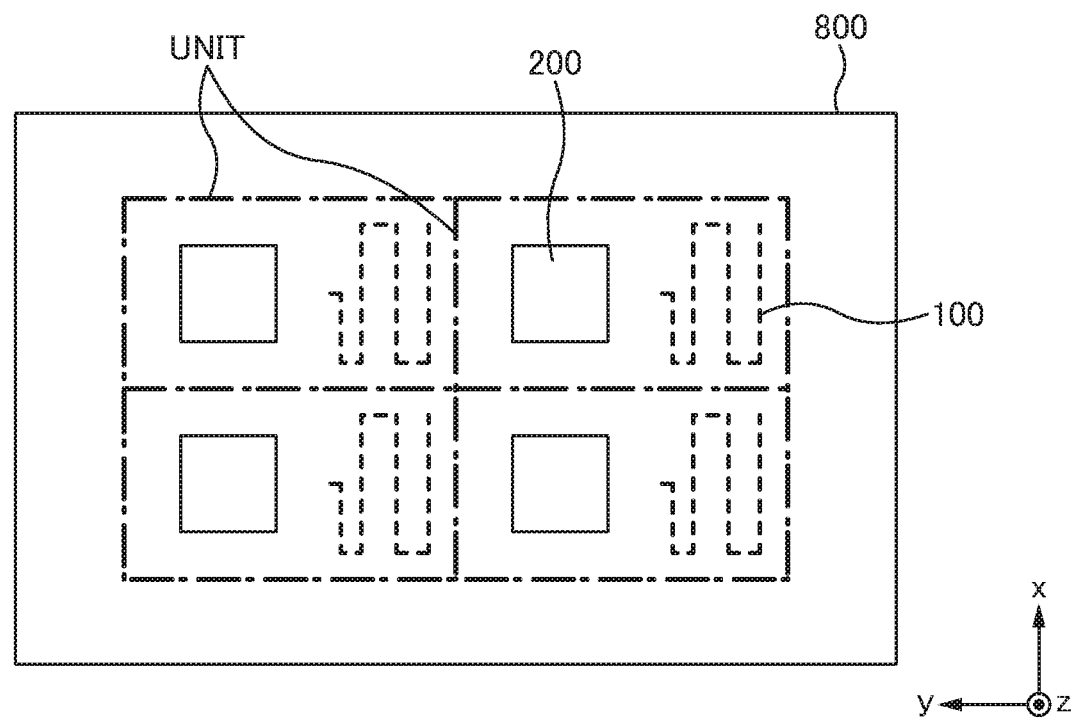
FIG. 4B is a diagram illustrating a method for manufacturing a wireless module according to an embodiment of the present disclosure.

Next, as shown in FIGS. 4A and 4B, the electronic circuit 200 is mounted in the first circuit region 501 on the front surface of the substrate 500. Electronic components necessary to function as the wireless module 1000, such as a semiconductor (IC, etc.), passive components (chip resistor, chip capacitor, etc.) a crystal oscillator are electrically connected to electrodes on the front surface of the substrate with solder, metal wire or the like. Thus, a desired circuit is realized and is prepared as a substrate 800 which has not sealed with resin (electronic-circuit-mounting step).

Figure 4C:
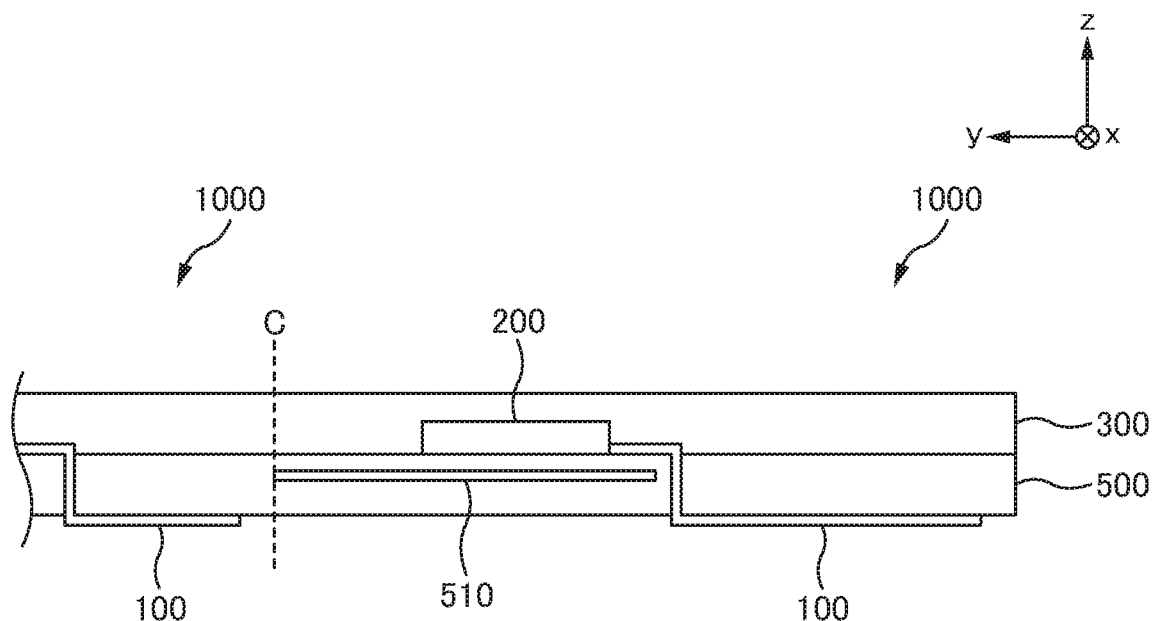
FIG. 4C is a diagram illustrating a method for manufacturing a wireless module according to an embodiment of the present disclosure.
Figure 4D:
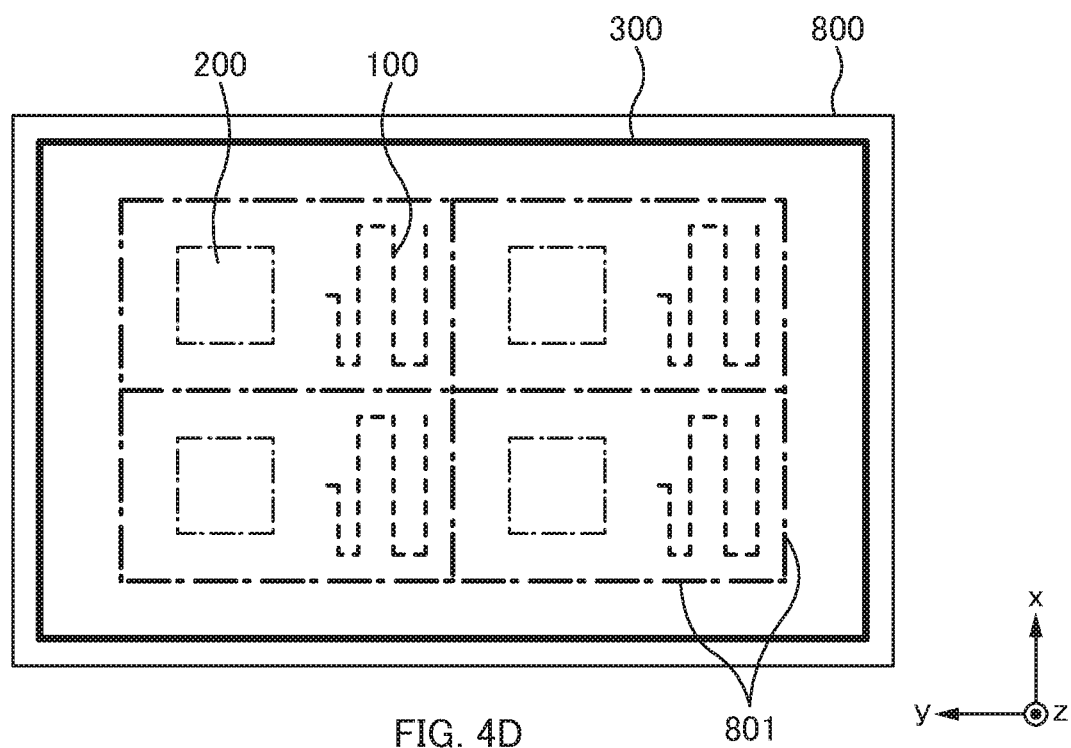
FIG. 4D is a diagram illustrating a method for manufacturing a wireless module according to an embodiment of the present disclosure.

Next, as shown in FIGS. 4C and 4D, the resin layer 300 is formed by covering with resin the entire front surface of the substrate 500 (resin-layer-forming step). The resin layer 300 is formed by applying resin of a predetermined thickness on the front surface of the substrate 500 and by subsequent curing it.

Generally, the following methods are used: transfer molding in which resin is poured into a mold constituting a cavity; printing in which resin is placed on a screen and applied onto a substrate with a squeegee; potting in which resin trickles; and the like.

In any method, resin is cured. But, in this curing process, the resin shrinks; and this causes cambers of the substrate 500, or this causes strain inside the substrate 500 as residual stress of shrinkage of the resin.

In FIG. 4D, the resin layer 300 covers a region a size larger than an arrangement regions 801 (dot dashed lines) which are arranged in a matrix.

Figure 4E:
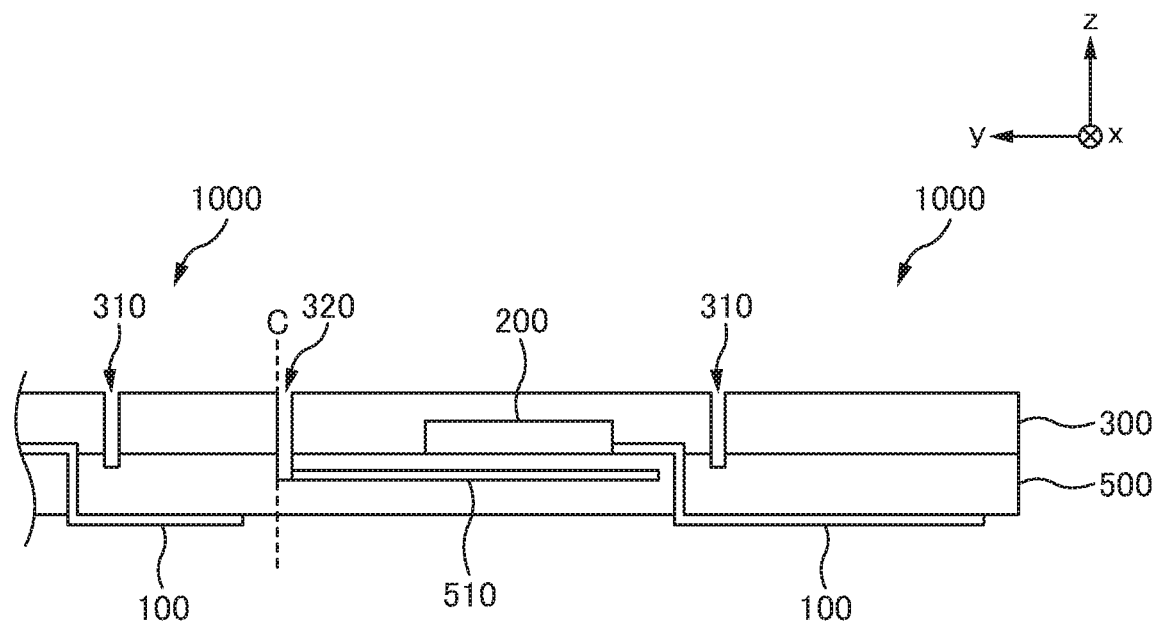
FIG. 4E is a diagram illustrating a method for manufacturing a wireless module according to an embodiment of the present disclosure.
Figure 4F:
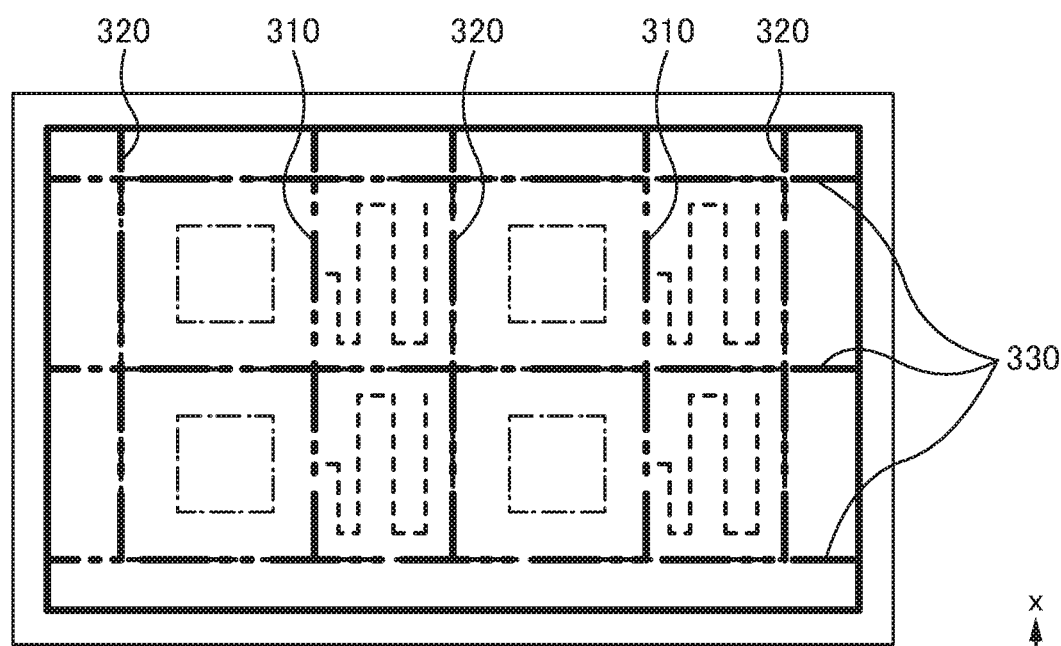
FIG. 4F is a diagram illustrating a method for manufacturing a wireless module according to an embodiment of the present disclosure.

Next, as shown in FIGS. 4E and 4F, grooves 310, 320 and 330 are formed in the resin layer 300 and extend longitudinally and laterally. The grooves 310 extending in x direction are along the boundary between the first circuit region 501 and the first antenna region 503, and have a depth which reaches from the surface of the resin layer 300 to the front surface of the substrate 500. The grooves 320 extending in x direction are along the cutting line C and have a depth which reaches to the ground layer 510 of the substrate 500.

The grooves 330 intersecting the grooves 310 and 320 and extending in y direction have a depth which reaches to the substrate 500 or a depth which does not, but almost reach to the substrate 500. These grooves are formed by blades of the dicing apparatus (groove-forming step). The grooves can be formed by a laser.

Figure 4G:
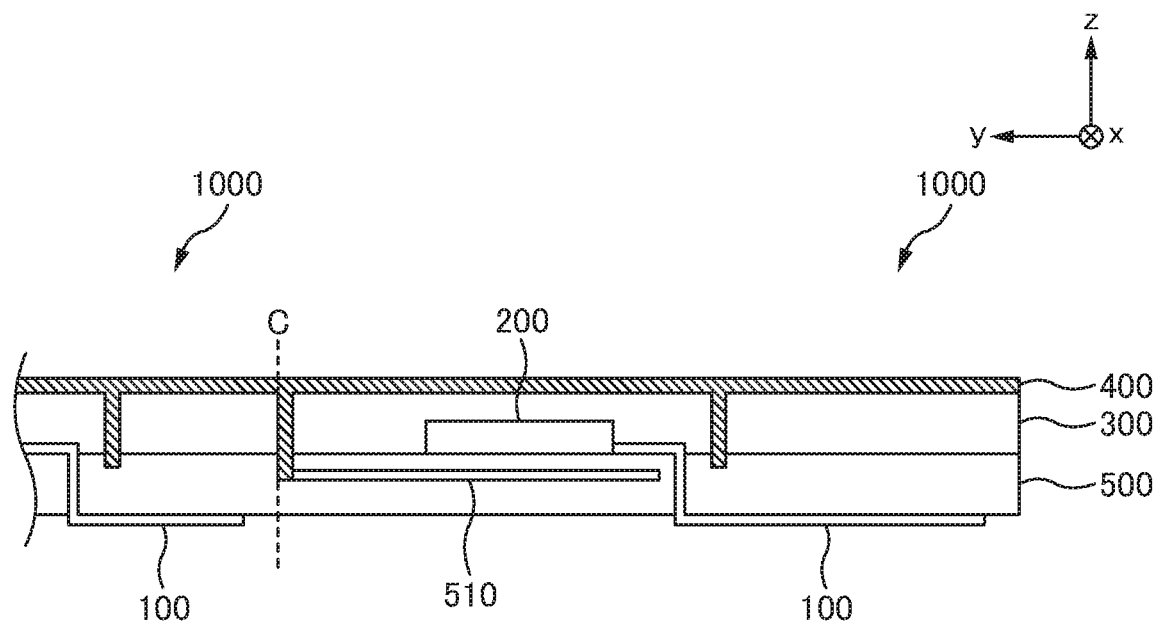
FIG. 4G is a diagram illustrating a method for manufacturing a wireless module according to an embodiment of the present disclosure.
Figure 4H:
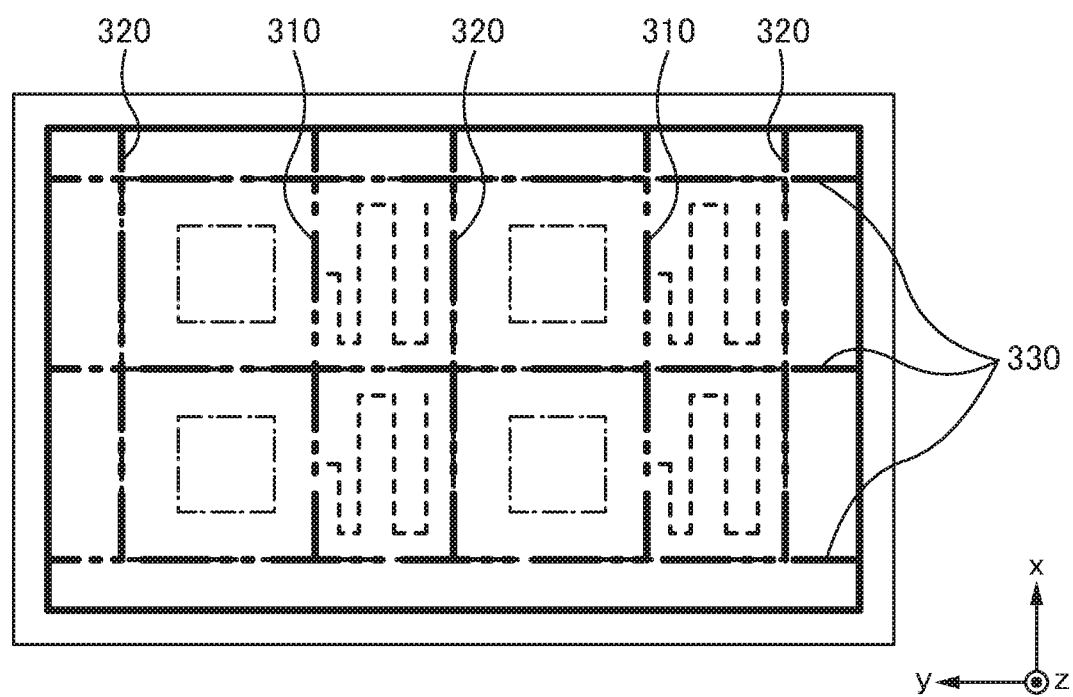
FIG. 4H is a diagram illustrating a method for manufacturing a wireless module according to an embodiment of the present disclosure.

As shown in FIGS. 4G and 4H, the shielding layer 400 is formed on the surfaces of the resin layer 300 (all outwardly-exposed surfaces of the resin layer 300) and inside the grooves 310, 320 and 330 (shielding-layer-forming step).

At this stage, the shielding layer 400 which has been formed inside the groove 320 is in contact with the ground layer 510 inside the substrate 500 and is electrically connected to it. And, the shielding layer 400 which has been formed inside the groove 310 reaches to the substrate 500. Further, the shielding layer 400 which has been formed inside the groove 330 reaches to the substrate 500, or reaches immediately before the front surface of the substrate 500.

If the groove 310 reaches to an inner layer of the substrate 500, it is possible to shield radiation noise traveling toward the antenna 100 on the back surface from components on the front surface of the substrate 500 through the inner layer of the substrate 500.

By the way, the shielding layer 400 can be realized by various methods. First, provided is a method by applying conductive paste. This method are exemplified by applying using screen printing, spin coating in which applying is performed by rotating the substrate 500 itself, and spraying. The material is resin which has fluidity and into which at least one metal selected from a group of Au, Ag, Ni, Cu and the like is mixed. Generally, Ag paste is often used.

Next, plating method will be described. This is a method in which, by immersing the main body in a plating bath, plating film is formed on the surface of the resin layer 300 and on the grooves 310, 320 and 330. The material is exemplified mainly by Cu, Al, Fe, Ag, Au or the like. Taking into consideration preventing oxidation of the shielding layer 400, it is also acceptable that a plurality of layers are coated by a plurality of substances selected from the foregoing material.

In addition, sputtering is available. In a case of sputtering, Cu, Al, SUS (Steel Special Use Stainless) are coated by a sputtering apparatus. However, since it is difficult to coat deep grooves like the grooves 310, 320 and 330 shown in FIGS. 4G and 4H, it is necessary to make the grooves 310, 320 and 330 shallow, or it is necessary to provide metal posts or wall-like parts in parts on which the grooves 310, 320 and 330 are formed, to substantially reduce the depth of the grooves 310, 320 and 330. This makes it possible to form a sputtering film in the grooves 310, 320 and 330. Similarly to plating, a plurality of layers may be formed. Or, a two-layered structure (Cu, SUS) or a three-layered structure (SUS, Cu, SUS) may be laminated from the bottom, to form the shielding layer 400. Note that, SUS serves as oxide film for Cu.

Figure 4I:
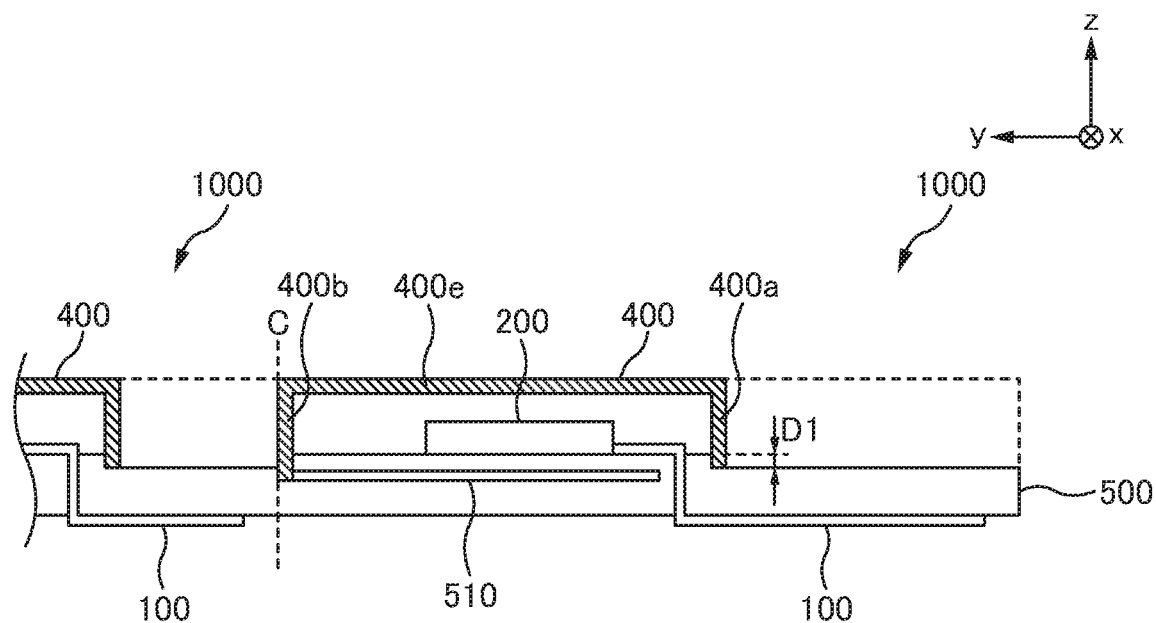
FIG. 4I is a diagram illustrating a method for manufacturing a wireless module according to an embodiment of the present disclosure.
Figure 4J:
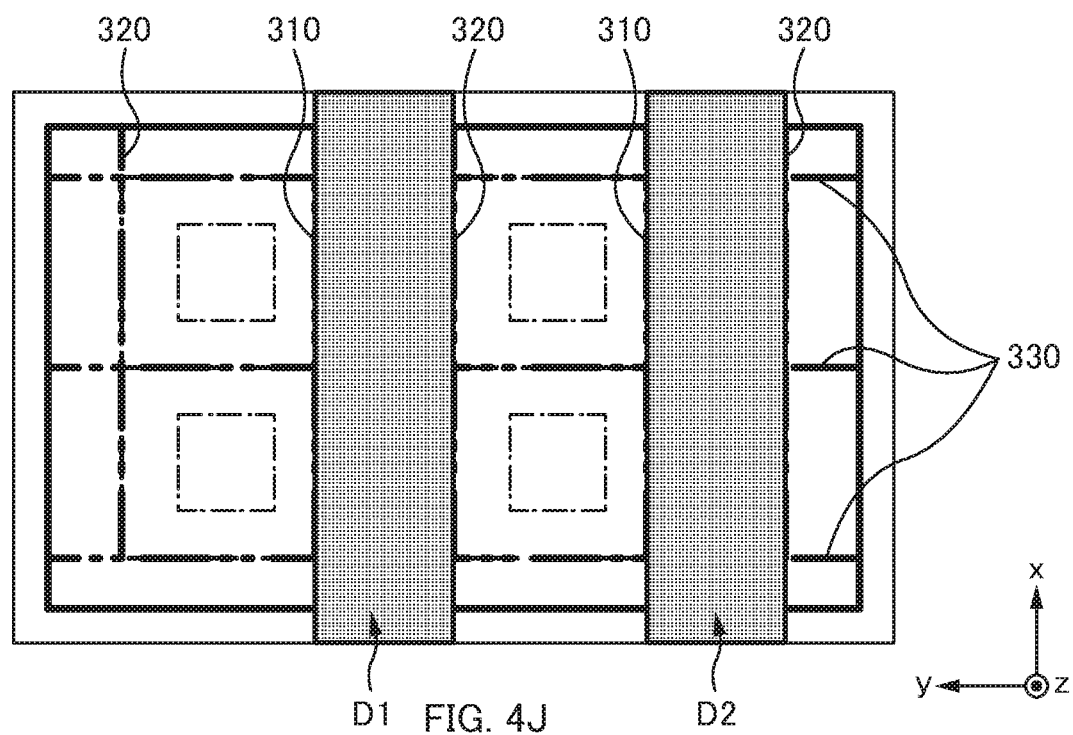
FIG. 4J is a diagram illustrating a method for manufacturing a wireless module according to an embodiment of the present disclosure.

Subsequently, as shown in FIGS. 4I and 4J, though the resin layer 300 and the shielding layer 400 have been formed throughout the front surface of the substrate 500, the resin layer 300 and the shielding layer 400 which are formed in the first antenna region 503 are removed by cutting using a polishing apparatus or a grinding apparatus such as a dicing apparatus (removing step).

This makes it possible to form the resin layer 300 and the shielding layer 400 only in the first circuit region 501.

In FIG. 4J, symbols D1 and D2 indicate regions of the large substrate 800 which are subject to the foregoing cutting and removing. Using blades of the dicing apparatus, grinding in x direction is performed from above or below in FIG. 4J and grinding in y direction is performed from right to left little by little; thereby, the resin layer 300 and the shielding layer 400 in the first antenna region 503 can be removed.

As shown in FIG. 4I, the following walls are not processed by cutting and are left: the wall 400a of the shielding layer 400 located on the boundary between the first antenna region 503 and the first circuit region 501; and the wall 400b of the shielding layer 400 opposite to the wall 400a of the shielding layer 400. However, in order to completely remove the resin layer 300, the surfaces of the walls 400a and 400b are sometimes slightly ground. A thickness enough for shielding remains. Accordingly, the front surface and three walls of the shielding layer 400 in the first antenna region 503 are removed.

Consequently, shielding layers 400a to 400e can cover throughout the surface of the resin layer 300 left in the first circuit region 501 (the four side surfaces (walls) and the front surface).

In this cutting process, it is preferable to reduce the remains of the resin layer 300 and the shielding layer 400 after grinding as less as possible in the first antenna region 503. As the remains of the resin layer 300 and the shielding layer 400 after grinding is reduced, it is possible to reduce performance deterioration of the antenna 100.

However, in actual manufacturing processes, it is difficult to reduce the remains of the resin layer 300 and the shielding layer 400 after grinding without any single cutting of the substrate 500.

Accordingly, in the cutting process, when removing the resin layer 300 and the shielding layer 400 from the first antenna region 503, it is possible to remove a top layer part of the substrate 500 (a part having a depth D1 from the front surface of the substrate 500) as shown in FIG. 4I. In this case, the board thickness A2 of the substrate 500 in the second antenna region 504 is smaller than the board thickness A1 in the first circuit region 501 (A1−A2=D1).

This makes it possible to reliably remove the resin layer 300 and the shielding layer 400 from the first antenna region 503. In addition, since the board thickness of the substrate 500 decreases, it is possible to more reliably prevent deterioration of characteristics of the antenna 100 formed in the second antenna region 504.

Also, it is possible to remove residual stress caused by resin shrinkage of the resin layer 300 left in the first antenna region 503.

Subsequently, full-cutting is performed on parts indicated by dotted dashed lines to be divided into individual pieces. Positioning is made so that the walls 400a to 400d of the shielding layer 400 remain, then full-cutting is performed. Consequently, finished is the wireless module 1000 according to an embodiment of the present disclosure shown in FIGS. 1 and 3.

In the wireless module 1000 finished as mentioned above, the resin layer 300 and the shielding layer 400 are formed only in the first circuit region 501, as mentioned above. As shown in FIG. 5B, this configuration decreases, effect of stress generated by cure shrinkage of the resin layer 300, and as a result can reduce the amount of deformation H2 of the substrate 500 compared to the amount of deformation H1 of the substrate 500 of the wireless module 2000. Simultaneously, when the antenna 100 transmits/receives radio wave, it is possible to reduce effects of the substrate 500 because the resin layer 300 and the shielding layer 400 are not formed in the first antenna region 503. Consequently, in the wireless module 1000, the capabilities for transmitting and receiving radio wave can be improved.

The foregoing configuration makes it possible to enhance flatness of the substrate 500 in the wireless module 1000 according to an embodiment of the present disclosure in which the antenna 100 and the electronic circuit 200 are mounted to the substrate 500 and which is sealed with resin. Accordingly, the wireless module 1000 can be appropriately mounted in the motherboard of an electronic device (not shown), and can enhance yield and reliability.

Although the wireless module 1000 and the method for manufacturing the wireless module 1000 according to the embodiments have been described in detail, the present invention is not limited thereto. The foregoing materials, shapes, arrangements or manufacturing procedures of the components are merely embodiments for carrying out the present invention. The various change, substitutions, and alterations could be made hereto without departing from the spirit and scope of the present invention.

For example, in this embodiment, the substrate 500 is a multi-layer substrate in which the ground layer 510 is formed inside. However, the substrate 500 may be a double-side substrate not having any layer inside. In this case, it is sufficient that the shielding layer 400 is electrically connected to a ground terminal by methods such as wire, wire bonding, plating or the like; the ground terminal is provided on the one face or the other face of the substrate 500, for example.

A method for manufacturing the wireless module 1000 is not limited to the foregoing method. A method whose processes are in a different order or a method including a different or an additional process may also be applied.

What is claimed is:

1. A wireless module, comprising: a substrate including a one face, another face, a first region and a second region located adjacent to the first region; an electronic circuit mounted in the first region on the one face of the substrate; a conductive pattern formed in the second region on the another face of the substrate and serving as an antenna, a resin layer sealing the electronic circuit in the first region; and a shielding layer formed on a surface of the resin layer and having conductivity, wherein the resin layer is absent in the second region, wherein the substrate has a step on said one face at a boundary between the first region and the second region such that the first region of the substrate is thicker than the second region of the substrate, and wherein the shielding layer covers an entire top surface and entire side surfaces of the resin layer and an entire face of said step so that the resin layer is encased by the one face of the substrate in the first region on which the electronic circuit is mounted and the shielding layer without exposing any surface of the resin layer to an exterior.

2. The wireless module according to claim 1, wherein
the substrate is a multi-layer substrate in which a ground layer is formed inside and which has conductivity, and
the shielding layer is electrically connected to the ground layer.

3. The wireless module according to claim 1, wherein
restricting terminals are provided at two corners located in the second region on the other face.

4. The wireless module according to claim 1, wherein:
the second region is defined as an entire remaining region other than the first region, and
a board thickness of the substrate in the second region is constant throughout the second region.

\* \* \* \* \*